US008022377B2

(12) United States Patent
Lubomirsky et al.

(10) Patent No.: US 8,022,377 B2
(45) Date of Patent: Sep. 20, 2011

(54) METHOD AND APPARATUS FOR EXCIMER CURING

(75) Inventors: Dmitry Lubomirsky, Cupertino, CA (US); Muhammad M. Rasheed, Fremont, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 579 days.

(21) Appl. No.: 12/107,281

(22) Filed: Apr. 22, 2008

(65) Prior Publication Data

US 2009/0261276 A1 Oct. 22, 2009

(51) Int. Cl.
*G21G 5/00* (2006.01)

(52) U.S. Cl. ............... 250/504 R; 250/492.1; 250/492.2; 250/493.1; 250/503.1

(58) Field of Classification Search ................ 250/492.1, 250/492.2, 493.1, 503.1, 504 R; 455/67; 438/478

See application file for complete search history.

(56) References Cited

U.S. PATENT DOCUMENTS

| | | | | |
|---|---|---|---|---|
| 2,763,806 A * | 9/1956 | Anderson, Jr. | ................ | 313/573 |
| 3,641,560 A * | 2/1972 | Klockenbrink | ................ | 340/318 |
| 3,733,709 A * | 5/1973 | Bassemir et al. | ................ | 34/277 |
| 5,013,959 A * | 5/1991 | Kogelschatz | ................ | 313/36 |
| 5,214,344 A * | 5/1993 | Kogelschatz | ................ | 313/17 |
| 5,359,255 A * | 10/1994 | Kawai et al. | ................ | 313/17 |
| 5,763,999 A * | 6/1998 | Matsuno et al. | ................ | 313/573 |
| 5,838,108 A * | 11/1998 | Frank et al. | ................ | 315/39 |
| 6,015,759 A * | 1/2000 | Khan et al. | ................ | 438/707 |
| 6,130,512 A * | 10/2000 | Manos et al. | ................ | 315/248 |
| 6,174,325 B1 * | 1/2001 | Eckhouse | ................ | 607/88 |
| 6,294,869 B1 * | 9/2001 | Adachi et al. | ................ | 313/607 |
| 6,343,089 B1 * | 1/2002 | Manos et al. | ................ | 372/82 |
| 6,376,972 B1 * | 4/2002 | Tarasenko et al. | ................ | 313/231.01 |
| 6,525,472 B2 * | 2/2003 | Okugi | ................ | 313/607 |
| 6,621,087 B1 * | 9/2003 | Bisges et al. | ................ | 250/492.1 |
| 6,628,078 B2 * | 9/2003 | Inayoshi | ................ | 313/607 |
| 6,657,367 B1 * | 12/2003 | Fukuda et al. | ................ | 313/234 |
| 6,723,293 B2 * | 4/2004 | Jensen | ................ | 422/186.07 |
| 6,739,716 B2 * | 5/2004 | Richards | ................ | 347/102 |
| 7,137,695 B2 * | 11/2006 | Yokoyama | ................ | 347/102 |

(Continued)

FOREIGN PATENT DOCUMENTS

JP 2006-134705 A 5/2006

OTHER PUBLICATIONS

PCT International Search Report and Written Opinion mailed Dec. 23, 2009; International Application No. PCT/US2009/040809, 11 pages.

*Primary Examiner* — Robert Kim
*Assistant Examiner* — Michael Logie
(74) *Attorney, Agent, or Firm* — Kilpatrick Townsend & Stockton LLP

(57) ABSTRACT

An apparatus for An apparatus for generating excimer radiation is provided. The apparatus includes a housing having a housing wall. An electrode is configured within the housing. A tubular body is around the electrode. The tubular body includes an outer wall and an inner wall. At least one inert gas is between the outer wall and the inner wall, wherein the housing wall and the electrode are configured to excite the inert gas to illuminate an excimer light for curing.

14 Claims, 10 Drawing Sheets

U.S. PATENT DOCUMENTS

| | | | |
|---|---|---|---|
| 7,501,292 B2 * | 3/2009 | Matsushita et al. | 438/16 |
| 7,683,343 B2 * | 3/2010 | Schiene et al. | 250/432 R |
| 2002/0074290 A1 * | 6/2002 | Jensen | 210/668 |
| 2004/0040496 A1 * | 3/2004 | Ohnoda et al. | 117/200 |
| 2004/0061079 A1 * | 4/2004 | Thompson et al. | 250/492.22 |
| 2005/0263719 A1 * | 12/2005 | Ohdaira et al. | 250/492.1 |
| 2006/0228871 A1 | 10/2006 | Wajda et al. | |
| 2006/0249078 A1 | 11/2006 | Nowak et al. | |
| 2006/0249175 A1 | 11/2006 | Nowak et al. | |
| 2006/0251827 A1 | 11/2006 | Nowak et al. | |
| 2007/0149086 A1 | 6/2007 | Nakamura | |
| 2007/0228289 A1 | 10/2007 | Kaszuba et al. | |
| 2007/0228618 A1 | 10/2007 | Kaszuba et al. | |
| 2009/0039757 A1 * | 2/2009 | Ohshima et al. | 313/484 |

* cited by examiner

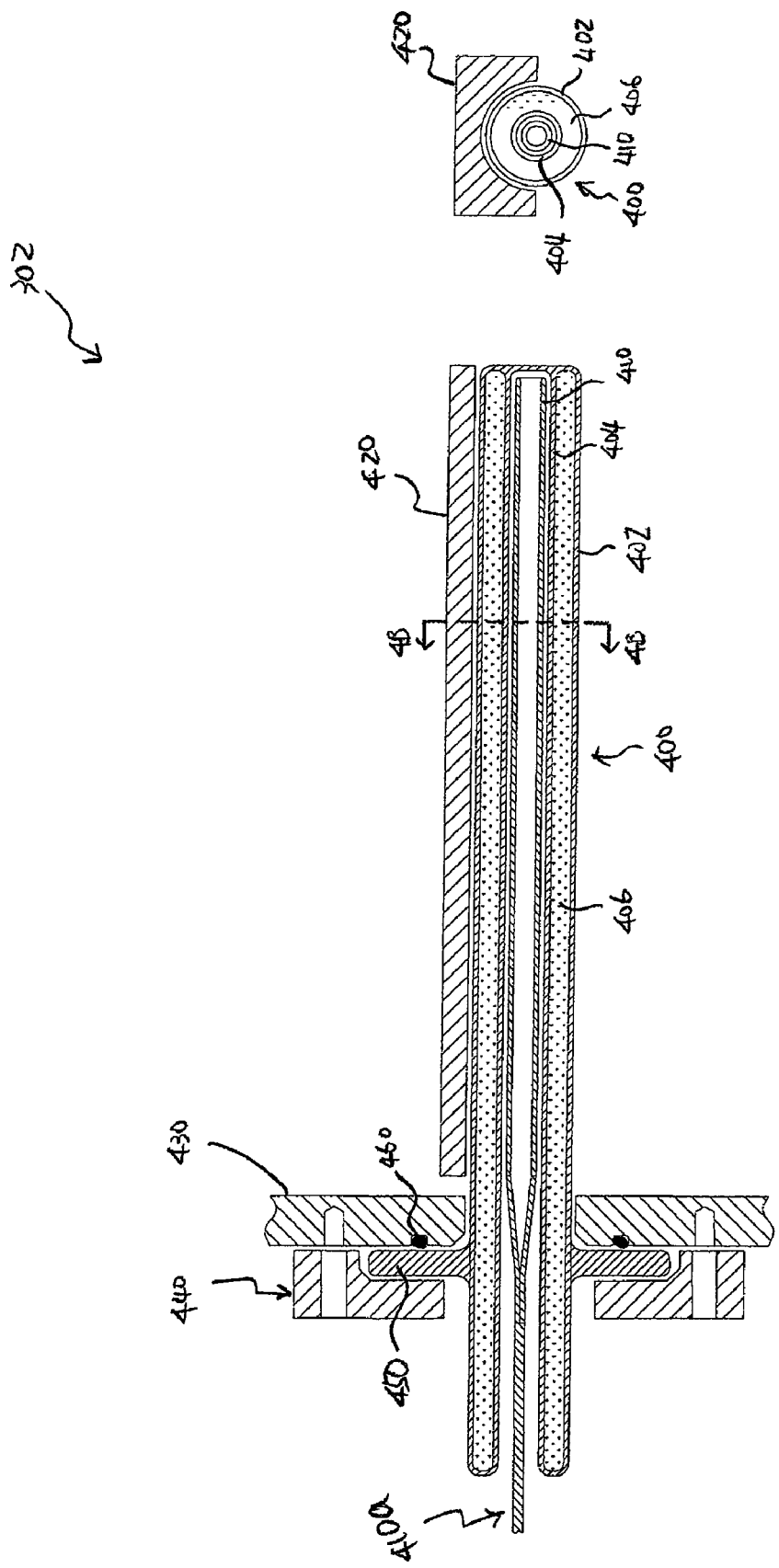

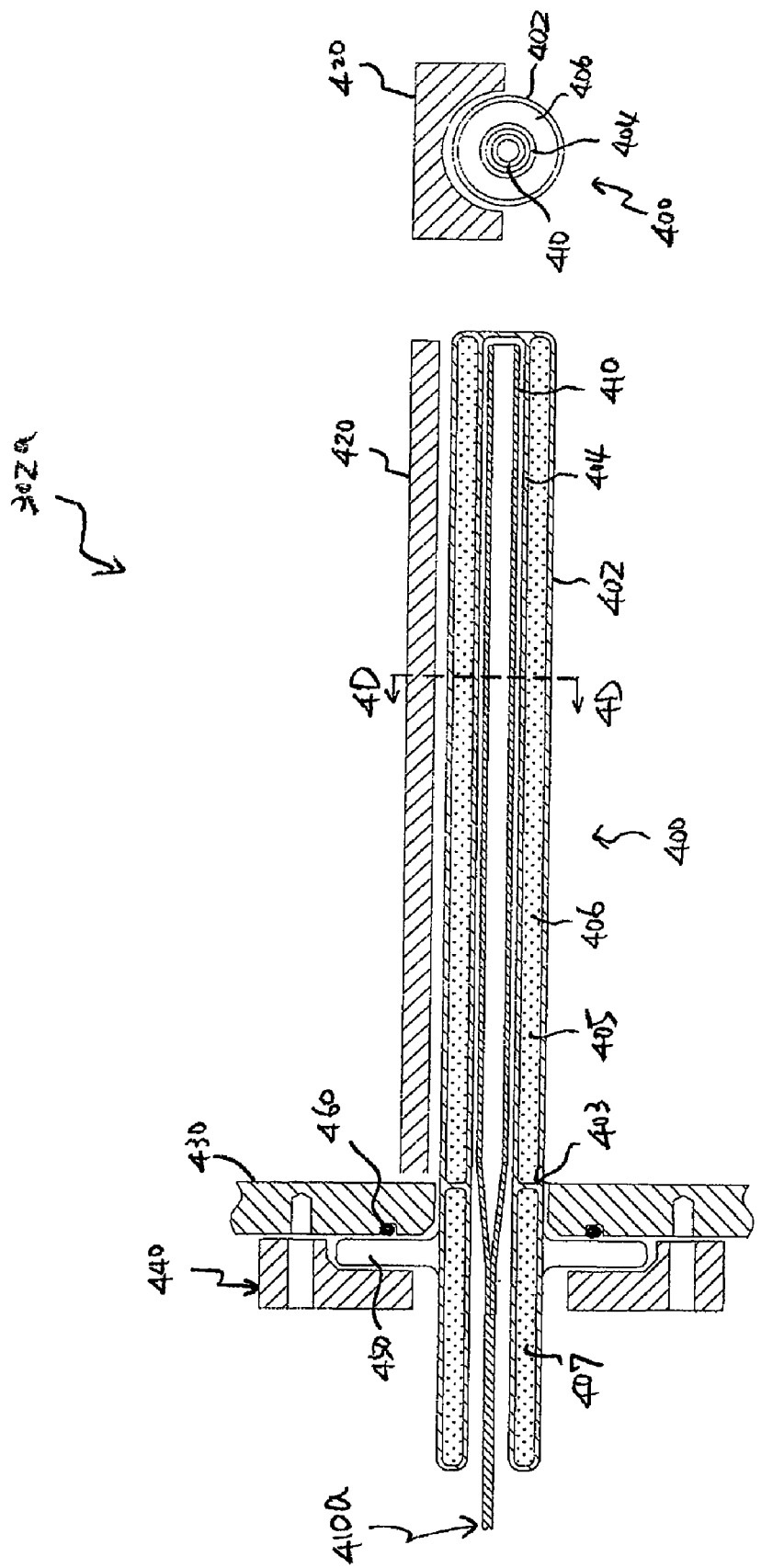

METHOD AND APPARATUS FOR EXCIMER CURING

CROSS-REFERENCES TO RELATED APPLICATIONS

This application is related to a co-assigned U.S. Patent Publication No. 2007/0295012, entitled "Nitrogen Enriched Cooling Air Module for UV Curing System," filed on Nov. 3, 2006 and assigned to Applied Materials, the assignee of the present application. The entire contents of the related applications are hereby incorporated by reference for all purposes.

BACKGROUND OF THE INVENTION

The present invention relates generally to methods and apparatus of semiconductor manufacturing process. More particularly, the invention provides methods and apparatus for excimer curing.

Materials such as silicon oxide ($SiO_x$), silicon carbide (SiC) and carbon doped silicon oxide ($SiOC_x$) films find widespread use in the fabrication of semiconductor devices. One approach for forming such silicon-containing films on a semiconductor substrate is through the process of chemical vapor deposition (CVD) within a chamber. For example, chemical reaction between a silicon supplying source and an oxygen supplying source may result in deposition of solid phase silicon oxide on top of a semiconductor substrate positioned within a CVD chamber. As another example, silicon carbide and carbon-doped silicon oxide films may be formed from a CVD reaction that includes an organosilane source including at least one Si—C bond.

Water is often a by-product of the CVD reaction of organosilicon compounds. As such, water can be physically absorbed into the films as moisture or incorporated into the deposited film as Si—OH chemical bond. Either of these forms of water incorporation are generally undesirable. Accordingly, undesirable chemical bonds and compounds such as water are preferably removed from a deposited carbon-containing film. Also, in some particular CVD processes, thermally unstable organic fragments of sacrificial materials need to be removed.

One conventional method used to address such issues is a thermal anneal. The energy from such an anneal replaces unstable, undesirable chemical bonds with more stable bonds characteristic of an ordered film thereby increasing the density of the film. Conventional thermal anneal steps are generally of relatively long duration (e.g., often between 30 min to 2 hrs) and thus consume significant processing time and slow down the overall fabrication process.

Another technique to address these issues utilizes ultraviolet radiation to aid in the post treatment of CVD silicon oxide, silicon carbide and carbon-doped silicon oxide films. The use of UV radiation for curing and densifying CVD films can reduce the overall thermal budget of an individual wafer and speed up the fabrication process. A number of various UV curing systems have been developed which can be used to cure films deposited on substrates.

Usually, an UV curing system has either mercury vapor lamps or metal halide doped mercury lamps powered by microwave generator. UV lamps generate light across a broad band of wavelengths from 170 nm to 600 nm. However, UV lamps usually have a short lifetime and provide low output of radiation at wavelength less than about 400 nm. Furthermore, particularly at wavelength less than 250 nm, the power output of UV lamps declines with the increasing use of the UV lamps.

Accordingly, improvements to existing UV curing systems and methods are desirable.

BRIEF SUMMARY OF THE INVENTION

Embodiments of the present invention pertain to apparatuses that provide benefits over previously known processes and apparatuses by employing an excimer lamp to excite an inert gas to illuminate an excimer light having a narrow range of bandwidth, such as 152 nm, 172 nm, 193 nm, 222 nm, 248 nm or 303 nm, for curing dielectric materials. The excimer light can have a desired power to cure dielectric materials even if its wavelength is under about 250 nm.

One embodiment of the invention provides an apparatus for generating excimer radiation. The apparatus includes a housing having a housing wall. An electrode is configured within the housing. A tubular body is around the electrode. The tubular body includes an outer wall and an inner wall. At least one inert gas is between the outer wall and the inner wall, wherein the housing wall and the electrode are configured to excite the inert gas to illuminate an excimer light for curing.

Another embodiment provides an apparatus for excimer curing dielectric material. The apparatus includes a chamber defining a substrate processing region. A substrate support is configured within and at a bottom region of the chamber. At least one excimer lamp is separated from the substrate support and configured to generate and transmit radiation to a substrate positioned over the substrate support. Each of the at least one excimer lamp includes an electrode. A tubular body is configured around the electrode. The tubular body includes an outer wall and an inner wall. At least one inert gas is between the outer wall and the inner wall. A reflector is adjacent to the outer wall of the tubular body, wherein the reflector and the electrode are configured to excite the inert gas to illuminate an excimer light for curing.

The other embodiment provides a method for excimer curing a dielectric material over a substrate. The substrate is disposed within a chamber having a chamber wall and an excimer lamp disposed within the chamber. The method includes applying a voltage drop between the chamber wall and the excimer lamp to excite an inert gas within the excimer lamp to illuminate an excimer light to cure the dielectric material.

These and other embodiments of the invention along with many of its advantages and features are described in more detail in conjunction with the text below and attached figures It should be understood, however, that the invention is not limited to the precise arrangements and instrumentalities shown.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

FIG. 4A is a schematic cross-sectional view of an example excimer lamp configured at a sidewall of a chamber according to an embodiment of the present invention;

FIG. 4B is a schematic cross-sectional view of the example excimer lamp of FIG. 4A along section line 4B-4B;

FIG. 5A is a schematic cross-sectional view of an example excimer lamp configured at a sidewall of a chamber according to an embodiment of the present invention;

FIG. 5B is a schematic cross-sectional view of the example excimer lamp of FIG. 5A along section line 5B-5B;

DETAILED DESCRIPTION OF THE INVENTION

The present invention relates to apparatus for curing dielectric materials such as low-k dielectric material, spin-on-glass (SOG), or other dielectric materials deposited over substrate, such as silicon wafers, liquid crystal display substrates, solar panel substrates, and others. The apparatus excites an inert gas to illuminate an excimer light having a narrow range of bandwidth, such as 152 nm, 172 nm, 193 nm, 222 nm, 248 nm or 303 nm, for curing dielectric materials. The excimer light can have a desired power to cure dielectric materials even if its wavelength is under about 250 nm. The apparatus includes a chamber having a chamber wall. An electrode is configured within the chamber. A tubular body is around the electrode. The tubular body includes an outer wall and an inner wall. At least one inert gas is between the outer wall and the inner wall, wherein the chamber wall and the electrode are configured to excite the inert gas to illuminate an excimer light for curing.

Figure 1:
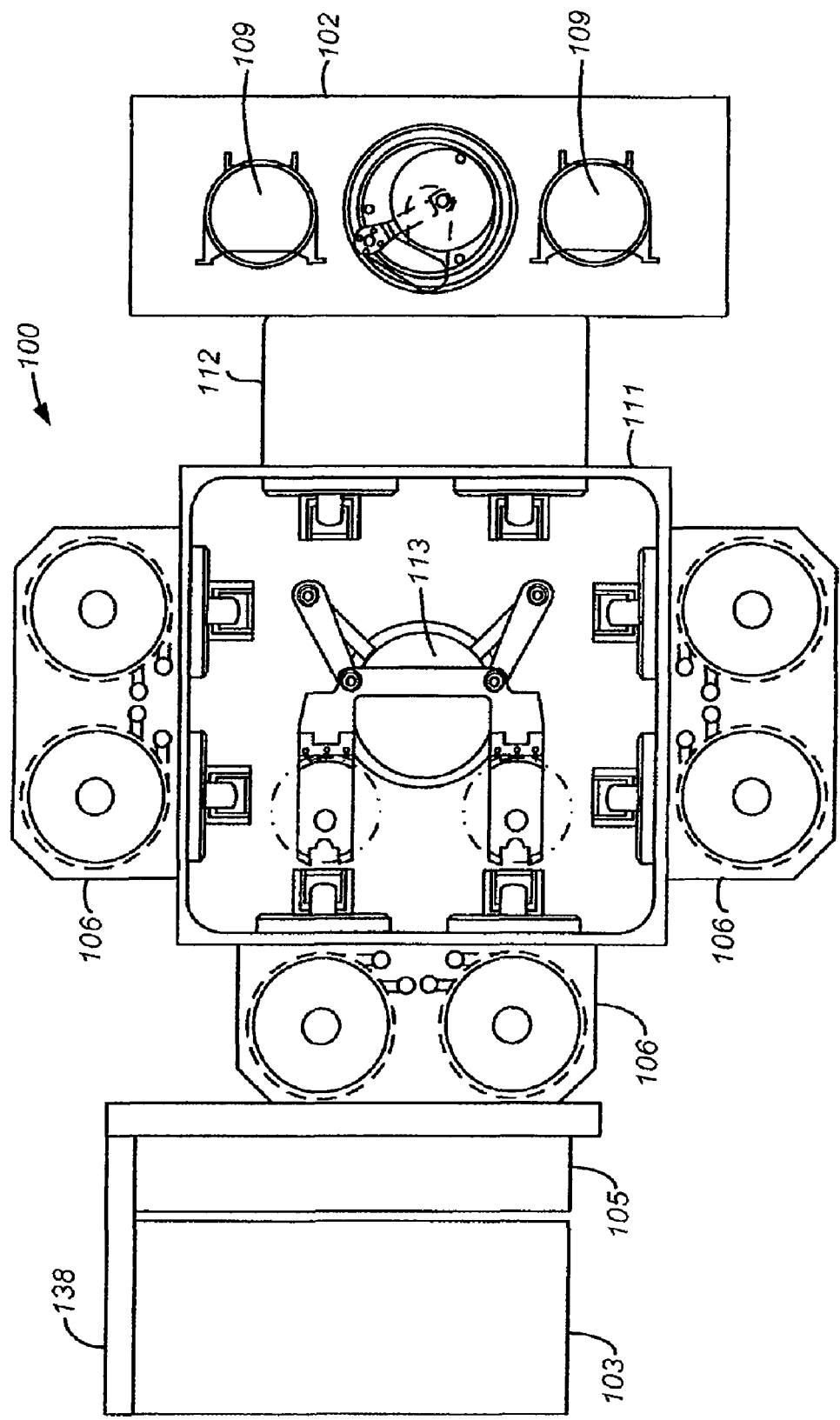
FIG. 1 is a simplified plan view of an exemplary semiconductor processing system.

FIG. 1 is a simplified plan view of a semiconductor processing system 100 in which embodiments of the invention may be incorporated. System 100 illustrates one embodiment of a Producer processing system, commercially available from Applied Materials, Inc., of Santa Clara, Calif. Processing system 100 is a self-contained system having the necessary processing utilities supported on mainframe structure 101. Processing system 100 generally includes front end staging area 102 where substrate cassettes 109 are supported and substrates are loaded into and unloaded from loadlock chamber 112, transfer chamber 111 housing substrate handler 113, a series of tandem process chambers 106 mounted on transfer chamber 111 and back end 138 which houses the support utilities needed for operation of system 100, such as gas panel 103 and power distribution panel 105.

Each of tandem process chambers 106 includes two processing regions for processing the substrates. The two processing regions share a common supply of gases, common pressure control and common process gas exhaust/pumping system. Modular design of the system enables rapid conversion from any one configuration to any other. The arrangement and combination of chambers may be altered for purposes of performing specific process steps. Any of the tandem process chambers 106 can include a lid according to aspects of the invention as described below that includes one or more excimer lamps for use in a cure process of a low K material on the substrate and/or in a chamber clean process. In one embodiment, all three of the tandem process chambers 106 have excimer lamps and are configured as excimer curing chambers to run in parallel for maximum throughput.

In an alternative embodiment where not all of tandem process chambers 106 are configured as excimer curing chambers, system 100 can be adapted with one or more of the tandem process chambers having supporting chamber hardware as is known to accommodate various other known processes such as chemical vapor deposition (CVD), physical vapor deposition (PVD), etch, and the like. For example, system 100 can be configured with one of tandem process chambers 106 and a CVD chamber for depositing materials, such as a low dielectric constant (K) film, on the substrates. Such a configuration can maximize research and development fabrication utilization and, if desired, eliminate exposure of as-deposited films to atmosphere.

Figure 2:
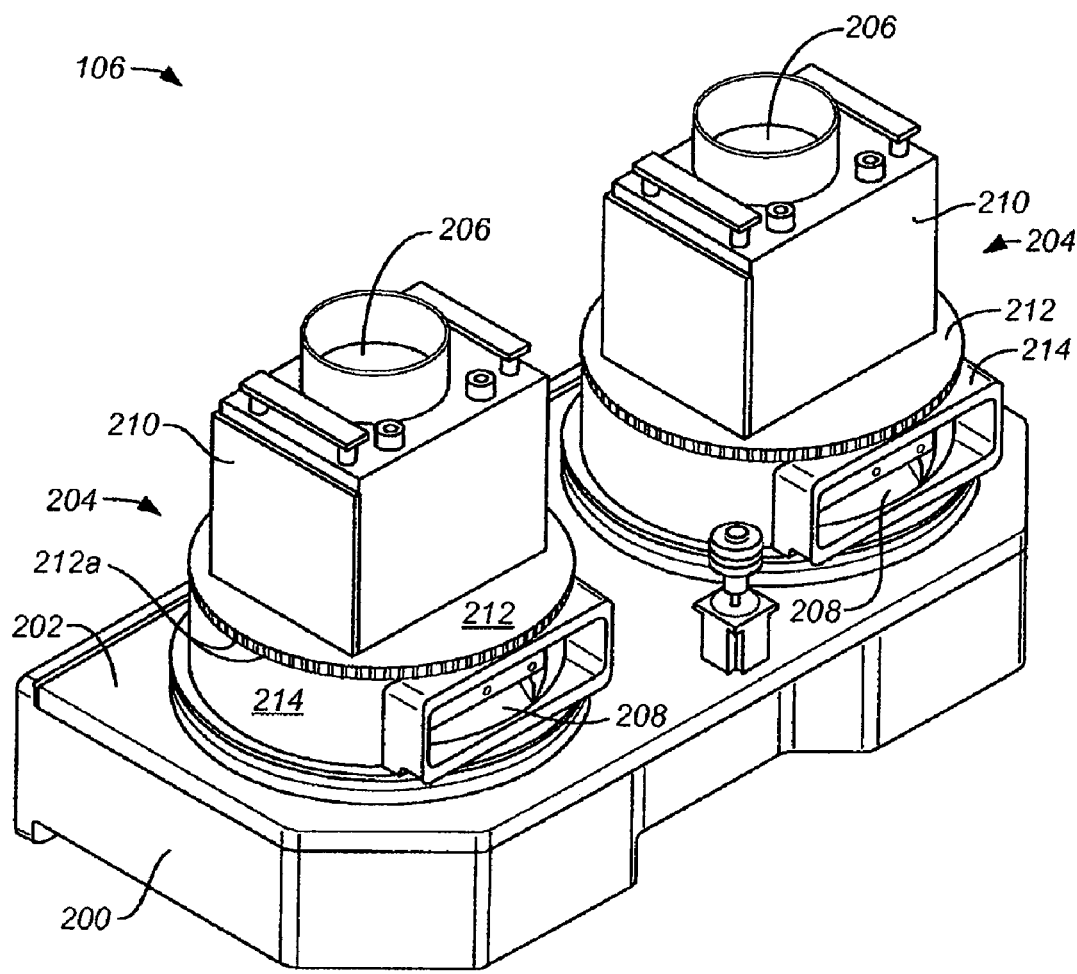
FIG. 2 is a simplified perspective view of one of exemplary tandem process chambers.

FIG. 2 is a simplified perspective view of one of tandem process chambers 106 shown in FIG. 2 that is configured for excimer curing. Tandem process chamber 106 includes body 200 and lid 202 that can be hinged to body 200. Coupled with lid 202 are two housings 204 that each includes inlets 206 along with outlets 208 for passing cooling air through an interior of housings 204. The cooling air can be at room temperature or approximately twenty-two degrees Celsius. A central pressurized air source (not shown) provides a sufficient flow rate of air to inlets 206 to insure proper operation of any excimer lamp bulbs and/or associated power sources for the bulbs. Outlets 208 receive exhaust air from the housings 204. Unlike a conventional UV curing lamp, the excimer lamps do not use ozone. Accordingly, ozone management issues can be avoided. Details of a cooling module that can be used in conjunction with tandem process chamber 106 can be found in U.S. Patent Publication No. 2007/0295012, entitled "Nitrogen Enriched Cooling Air Module for UV Curing System," filed on Nov. 3, 2006 and assigned to Applied Materials, the assignee of the present application. The 2007/0295012 application is hereby incorporated by reference in its entirety.

Each housing 204 includes upper housing 210 in which an excimer lamp (not shown) is placed and lower housing 214 in which a secondary reflector (not shown) is placed. Some embodiments of the invention further include disc 212 having a plurality of teeth 212a that grip a corresponding belt (not shown) that couples disc 212 to spindle 216 which in turn is operatively coupled with a motor (not shown). The combination of discs 212, belts, spindle 216 and motor allow upper housings 210 (and the excimer lamps mounted therein) to be rotated relative to a substrate positioned on substrate support below lid 202.

Figure 3:
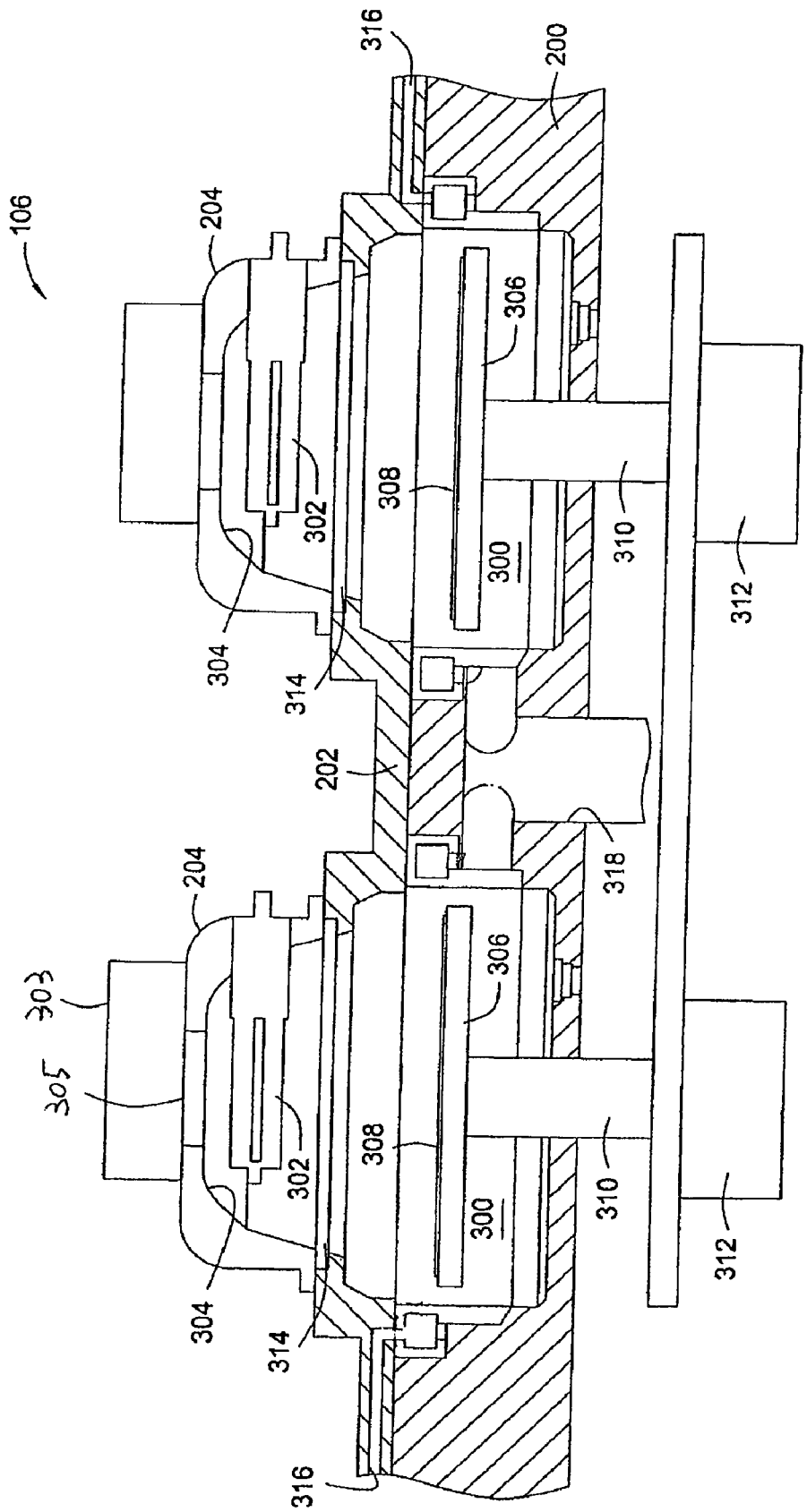
FIG. 3 shows a partial section view of an exemplary tandem process chamber.

FIG. 3 shows a partial section view of the tandem process chamber 106 with lid 202, housings 204 and power sources 303. Each of housings 204 covers a respective one of two excimer lamps 302 disposed respectively above two process regions 300 defined within body 200. Each of process regions 300 includes heating pedestal 306 for supporting substrate 308 within process regions 300. Pedestals 306 can be made from ceramic or metal such as aluminum. Some embodiments, pedestals 306 couple to stems 310 that extend through a bottom of body 200 and are operated by drive systems 312 to move pedestals 306 in processing regions 300 toward and away from excimer lamps 302. Drive systems 312 can also rotate and/or translate pedestals 306 during curing to further enhance uniformity of substrate illumination. Adjustable positioning of pedestals 306 enables control of volatile cure by-product and purge and clean gas flow patterns and residence times in addition to potential fine tuning of incident excimer irradiance levels on substrate 308 depending on the nature of the light delivery system design considerations such as focal length.

In general, embodiments of the invention contemplate any excimer source such as pulsed helium, neon, argon, krypton or xenon flash lamps that can generate radiation with wavelength specifically at, for example, 152 nm, 172 nm, 193 nm, 222 nm, 248 nm or 303 nm. Excimer lamps 302 are filled with one or more gases such as helium, neon, argon, krypton or xenon for excitation by power sources 303. Preferably, power sources 214 are radio frequency (RF) generators. The RF generators can generate frequency between about 50 kHz and about 180 MHz. In one embodiment, each of housings 204 includes aperture 305 adjacent to power sources 303 to receive an RF power from power sources 303.

Excimer lamps 302 can emit an excimer light having a narrow range of bandwidth, such as about 152 nm, 172 nm, 193 nm, 222 nm, 248 nm or 303 nm. The gases selected for use within excimer lamps 302 can determine the wavelengths emitted. Unlike a conventional UV lamp that emits an UV light having a broadband of wavelengths from 170 nm to 400 nm, excimer lamps 302 can emit light having a narrow range of bandwidth corresponding to bonding energies of silicon-silicon (Si—Si), silicon-oxygen (Si—O), silicon-nitrogen (Si—N) and/or silicon-carbon (Si—C) so as to cure dielectric material, such as oxide, nitride, oxynitride, carbide-containing dielectric material, or other dielectric material. Excimer lamps 302 can provide desired power output at wavelengths lower than about 400 nm for curing dielectric materials. By using the excimer lamp, curing dielectric material such as low-k dielectric material can be more desirably achieved. In embodiments, the distance between excimer lamps 302 and substrate 308 can be between about 1 mm and about 200 mm. In other embodiments, the distance can be between about 1 mm and about 60 mm.

Light emitted from excimer lamps 302 enters processing regions 300 by passing through windows 314 disposed in apertures in lid 202. Windows 314 can be made of an OH free synthetic quartz glass and have sufficient thickness to maintain vacuum without cracking. Further, windows 314 can be fused silica that transmits light down to approximately 150 nm. Processing or cleaning gases enter process regions 300 via a respective one of two inlet passages 316. The processing or cleaning gases then exit process regions 300 via common outlet port 318. Additionally, the cooling air supplied to the interior of housings 204 circulates past excimer lamps 302, but is isolated from process regions 300 by windows 314.

In one embodiment, each of housings 204 includes an interior parabolic surface defined by cast quartz lining 304 coated with a dichroic film. Quartz linings 304 reflect light emitted from excimer lamps 302 and are shaped to suit both the cure processes as well as the chamber clean processes based on the pattern of excimer light directed by quartz linings 304 into process regions 300. For some embodiments, quartz linings 304 adjust to better suit each process or task by moving and changing the shape of the interior parabolic surface. Additionally, quartz linings 304 can desirably transmit light emitted by excimer lamps 302 due to the dichroic film. The dichroic film usually constitutes a periodic multilayer film composed of diverse dielectric materials having alternating high and low refractive index. Since the coating is non-metallic, microwave radiation from power sources 303 that is downwardly incident on the backside of cast quartz linings 304 does not significantly interact with, or get absorbed by, the modulated layers and is readily transmitted for ionizing the gas in excimer lamps 302.

In embodiments, rotating or otherwise periodically moving quartz linings 304 during curing and/or cleaning enhances the uniformity of illumination in the substrate plane. In yet another embodiment, entire housings 204 rotate or translate periodically over substrate 308 while quartz linings 304 are stationary with respect to excimer lamps 302. In still another embodiment, rotation or periodic translation of substrate 308 via pedestals 306 provides the relative motion between substrate 308 and excimer lamps 302 to enhance illumination and curing uniformity.

For cure processes, pedestals 306 are heated to between about 100° C. and about 1,100° C., preferably about 300° C. and about 750° C. The pressure within processing regions 300 can be between about 500 micron Torr (μTorr) and about 500 Torr, preferably between about 500 mTorr and about 5 Torr in order to desirably cure substrate 308. During the curing treatment, pedestals 306 can rotate substrate 308 between about 1 rotate per minute (rpm) and about 300 rpm to uniformly expose substrate 308 to light generated from excimer lamps 302.

FIG. 4A is a schematic cross-sectional view of an exemplary excimer lamp configured at a sidewall of a housing according to an embodiment of the present invention. FIG. 4B is a schematic cross-sectional view of the example excimer lamp of FIG. 4A along section line 4B-4B.

In FIG. 4A, excimer lamp 302 includes electrode 410, reflector 420, and tubular body 400. Tubular body 400 is around electrode 410. Tubular body 400 includes outer wall 402 and inner wall 404. At least one inert gas such as He, Ne, Ar, Kr and Xe is filled and sealed between inner wall 404 and outer wall 402. Reflector 420 is configured adjacent to outer wall 402 of tubular body 400. Reflector 420 can be substantially grounded, and electrode 410 can be coupled with RF power source 303 (shown in FIG. 3) to excite inert gas 406 to emit an excimer light having a narrow range of bandwidth for curing. Tubular body 400 is configured through sidewall 430 of the housing. Brazed vacuum flanges 450 attached to the tubular body 400 are configured between sidewall 430 and lamp clamps 440. O-ring 460 is configured within a groove of sidewall 430 to desirably seal the housing and/or maintain the pressure within the housing. It is noted the shape of tubular body 400 is not limited to that as shown in FIG. 4A. Tubular body 400 can have any shape that can desirably accommodate electrode 410.

Excimer lamp 302 can excite the inert gas to illuminate excimer light by applying a high voltage to electrode 410 and substantially grounding reflector 420 and/or housing sidewall 430. The excimer light can cure dielectric materials, such as low-k dielectric materials, to desirably remove moistures and densify the dielectric materials.

In embodiments, wire 410a coupled with electrode 410 is configured within tubular body 400 and is free from being exposed within tandem process chamber 106. The configuration can desirably prevent generation of plasma within tandem process chamber 106 due to the high voltage applied to wire 410a and substantially grounded housing sidewall 430. Additionally, a pressure is provided in the space between electrode 410 and inner wall 404 of tubular body 400. The pressure is provided such that plasma is substantially free from being generated within the space when electrode 410 and reflector 420 and/or sidewall 430 are configured to generate the excimer light. The pressure can be, for example, about an atmosphere pressure, and different from the pressure within housing 204 (shown in FIG. 3).

In FIG. 4B, reflector 420 can be substantially semi-cylindrical around outer wall 402 of tubular body 400. Reflector 420 can desirably reflect excimer light emitted from excimer lamp 302. Reflector 420 can be substantially grounded. One of ordinary skill in the art can modify reflector 420 to cover outer wall 402 to generate a desired radiation for curing.

FIG. 5A is a schematic cross-sectional view of an exemplary excimer lamp configured at a sidewall of a housing according to an embodiment of the present invention. FIG. 5B is a schematic cross-sectional view of the exemplary excimer lamp of FIG. 5A along section line 5B-5B.

In FIG. 5A, another exemplary excimer lamp 302a is provided. Partition walls 403 contact inner wall 404 and outer wall 402. Partition walls 403 separate area 405 adjacent to one end of tubular body 400 from other area 407 adjacent to the other end of tubular body 400. Inert gas 406 is filled and sealed within area 405. It is optional that gas such air or other gas can be filled and/or sealed in area 407. Partition walls 403 may be substantially adjacent to sidewall 430 of the housing.

Partition walls 403 of excimer lamp 302a separate area 407 from area 405. Gas other than inert gas can be filled within area 407. During exciting inert gas 406 in area 405, no substantially excimer light is generated from the gas in area 407. O-ring 460 can be desirably free from being subjected to excimer light from area 407. The life span of O-ring 460 can be more desirably extended. O-rings 460 can desirably seal the housing.

Figure 6A:
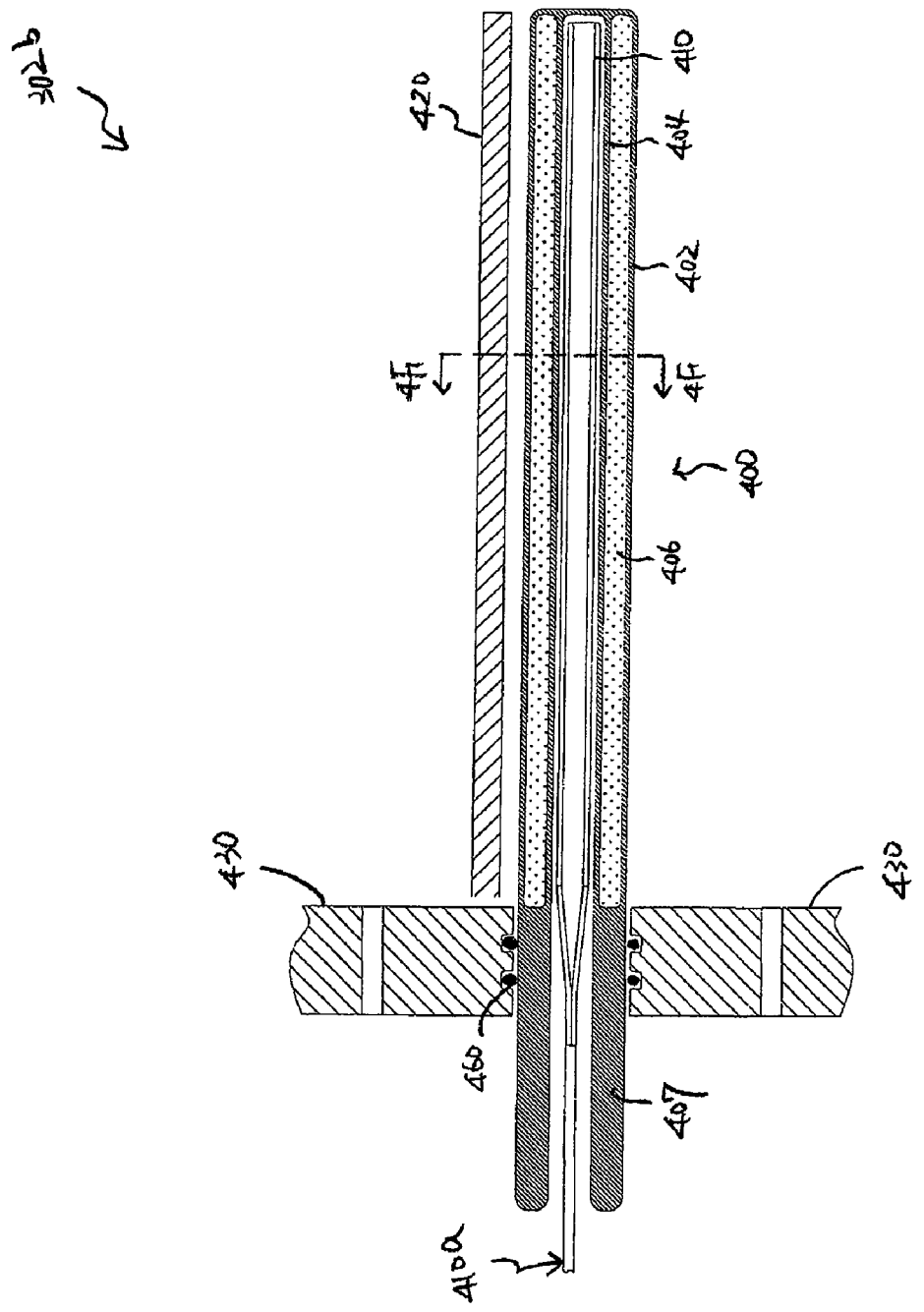
FIG. 6A is a schematic cross-sectional view of an example excimer lamp configured at a sidewall of a chamber according to an embodiment of the present invention.
Figure 6B:
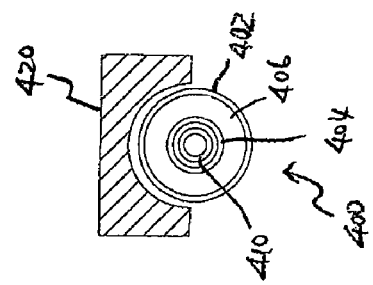
FIG. 6B is a schematic cross-sectional view of the example excimer lamp of FIG. 6A along section line 6B-6B.

FIG. 6A is a schematic cross-sectional view of an example excimer lamp configured at a sidewall of a housing according to another embodiment of the present invention. FIG. 6B is a schematic cross-sectional view of the example excimer lamp of FIG. 6A along section line 6B-6B.

In FIG. 6A, the other exemplary excimer lamp 302b is provided. Excimer lamp 302b has dielectric material area 407a such as glass and/or any solid dielectric material. The use of brazed vacuum flange 450 (shown in FIGS. 4A and 5A) is optional if sidewall 430 can desirably hold excimer lamp 302b. O-rings 460 are configured within grooves of the housing wall and between tubular body 400 and the housing wall. With dielectric material area 407a, no excimer light can be generated from solid dielectric material area 407a when excimer lamp 302b generates an excimer light. In addition, sidewall 430 can substantially block excimer light generated from inert gas 406 within area 405. O-rings 460 is not subjected any excimer light from solid dielectric material area 407a. Accordingly, O-rings 460 can be desirably prevented from being damaged during the excimer curing process. The life span of O-rings 460 can be more desirably extended and O-rings 460 can desirably seal the housing.

Figures 7A, 7B:
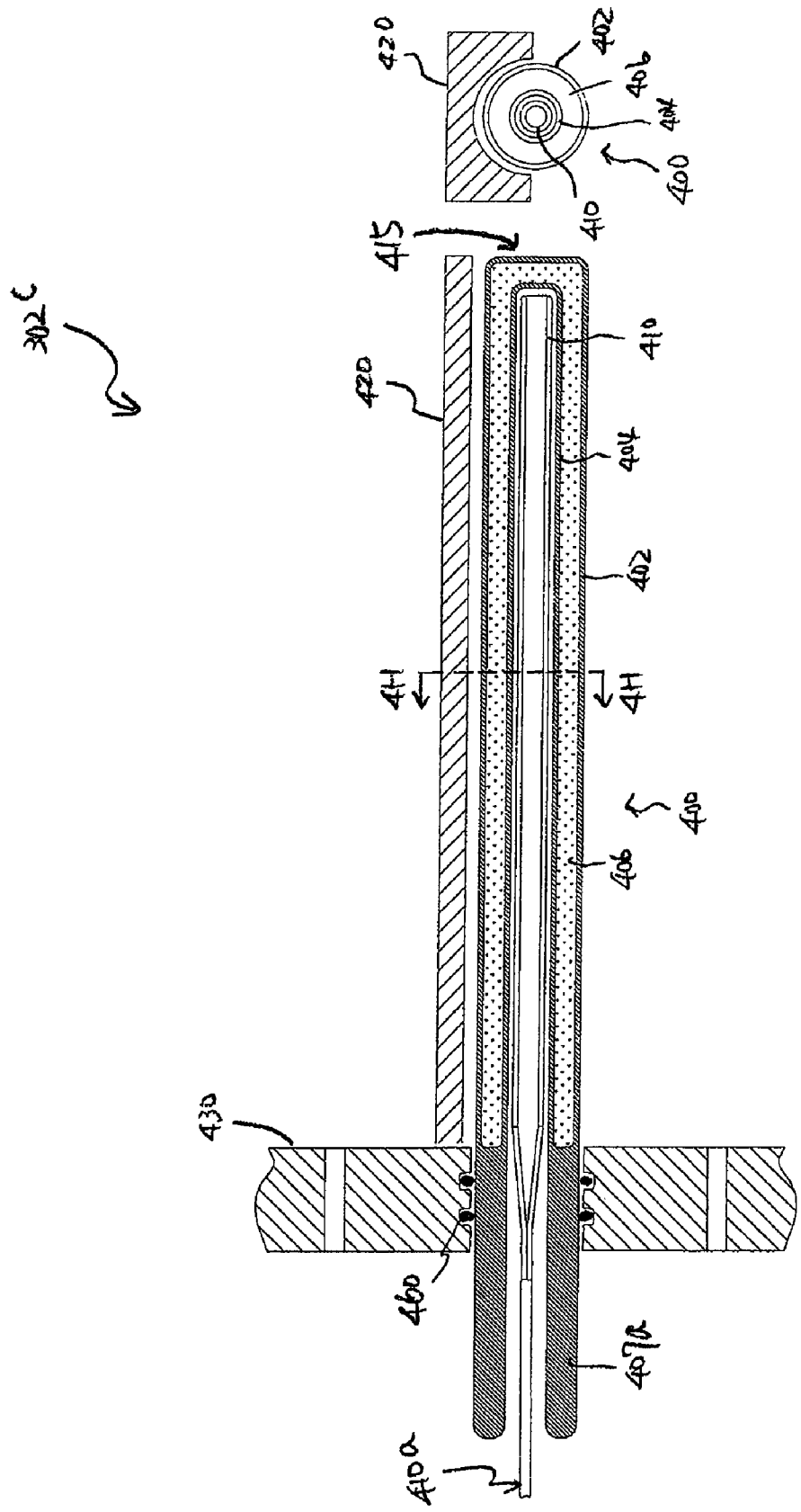
FIG. 7A is a schematic cross-sectional view of an example excimer lamp configured at a sidewall of a chamber according to an embodiment of the present invention.
FIG. 7B is a schematic cross-sectional view of the example excimer lamp of FIG. 7A along section line 7B-7B.

FIG. 7A is a schematic cross-sectional view of an example excimer lamp configured at a sidewall of a housing according to still another embodiment of the present invention. FIG. 7B is a schematic cross-sectional view of the example excimer lamp of FIG. 7A along section line 7B-7B.

In FIG. 7A, an exemplary excimer lamp 302c is provided. In FIG. 7A, excimer lamp 302c has inner wall 404, which is separated from outer wall 402 at the region adjacent to end 415 of tubular body 400. When sidewall 430 is substantially grounded or floating for generating excimer light, electrode 410 and sidewall 430 can substantially excite the inert gas between inner wall 404 and outer wall 402. The gap between outer wall 402 and inner wall 404 at the region adjacent to end 415 can desirably prevent generating plasma by electrode 410 and sidewall 430 within the chamber.

Figure 8:
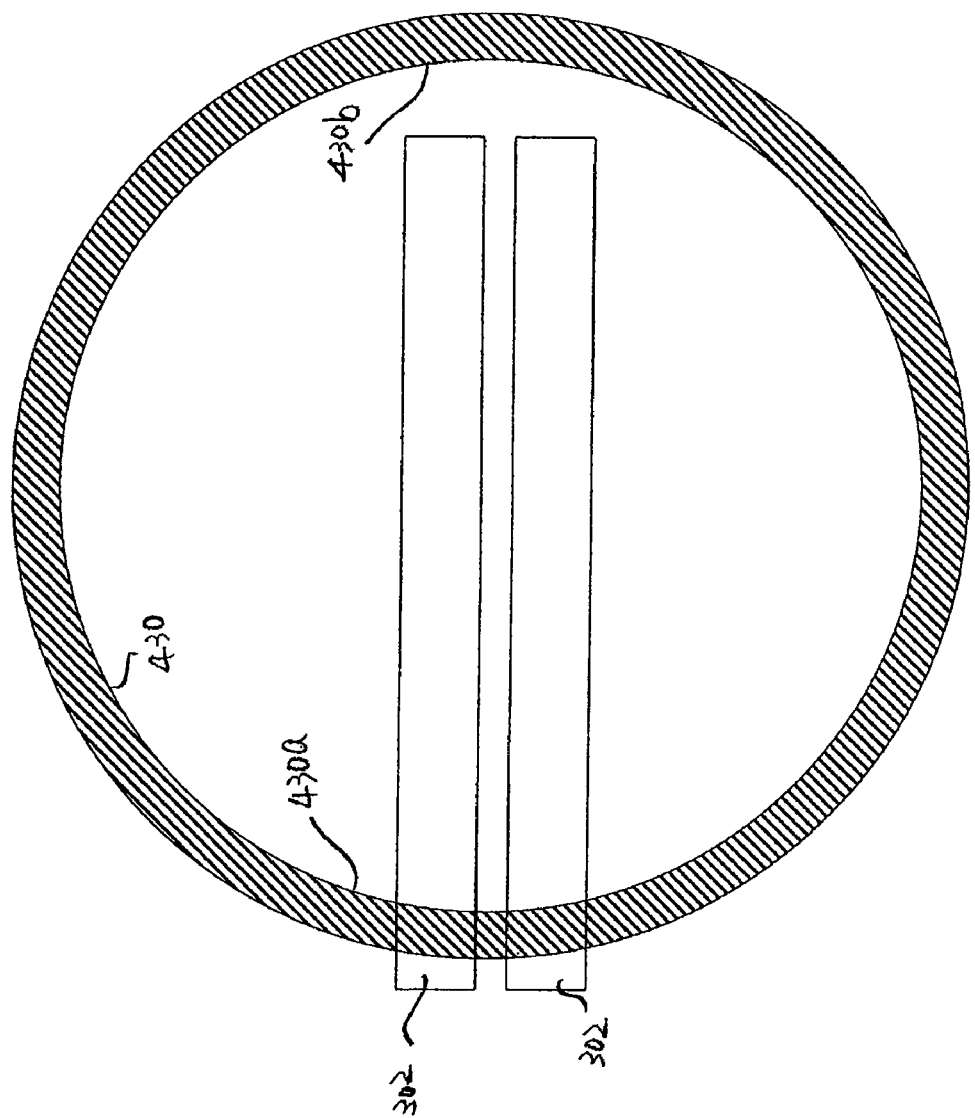
FIGS. 8-10 are schematic drawings showing exemplary configurations of excimer lamps within a chamber.
Figure 9:
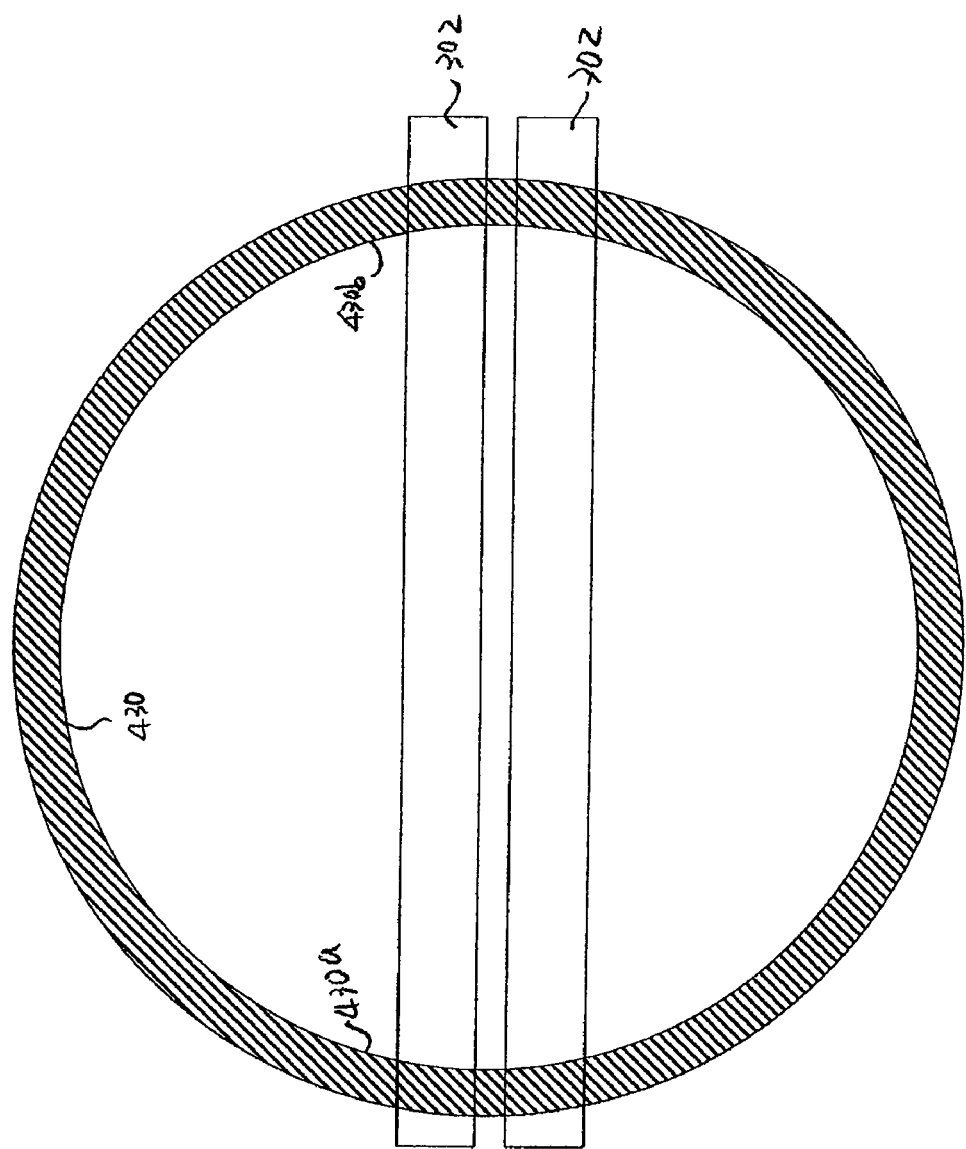
Figure 10:
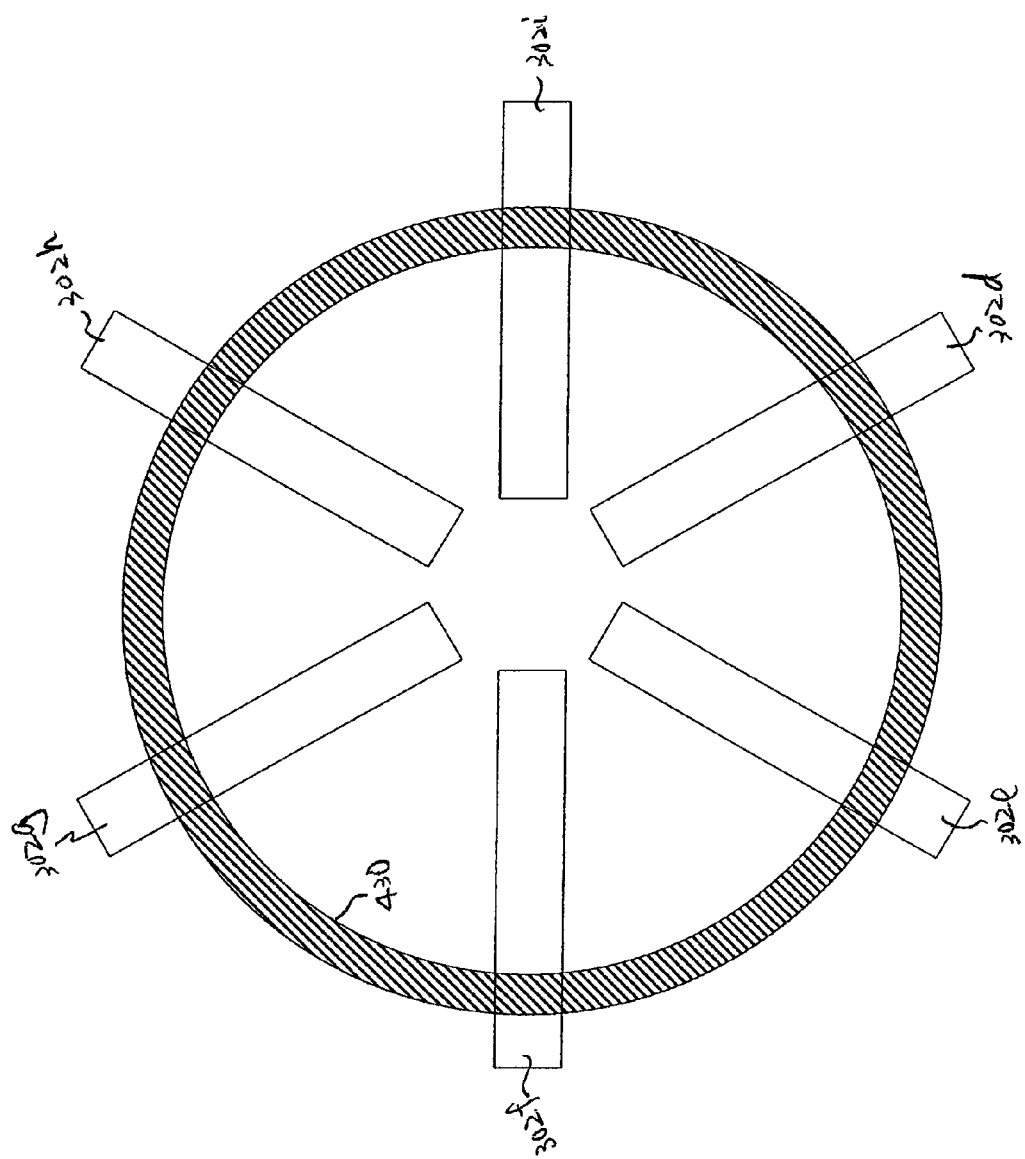

FIGS. 8-10 are schematic drawings showing exemplary configurations of excimer lamps within a housing. In FIG. 8, excimer lamps 302 are substantially parallel configured within the housing. One end of each of excimer lamps 302 is configured through sidewall 430a and the other end of each of excimer lamps 302 is distant from sidewall 430b. In embodiments, excimer lamps 302 may be configured adjacent to the center of the housing. The number of excimer lamps 302 shown in FIG. 8 is merely exemplary. The scope of the invention is not limited thereto. One or more than two excimer lamps 302 can be configured within the housing if the housing can accommodate the number of excimer lamps 302. In embodiments, the number of excimer lamps 302 can be between about 2 and about 12. Excimer lamps 302 and 302a-302c described above in conjunction with FIGS. 4A, 5A, 6A, and 7A can be optionally used.

In FIG. 9, both ends of each of excimer lamps 302 are configured through sidewalls 430a and 430b. Since each end of excimer lamps 302 is not configured within the chamber, ends of electrodes 410 within each of the excimer lamps 302 and sidewalls 430a and 430b do not generate plasma within chamber. The configuration of lamps 302 in FIG. 9 can desirably prevent ionizing gas in the chamber. In embodiments, excimer lamps 302 and 302a-302c described above in conjunction with FIGS. 4A, 5A, 6A, and 7A can be optionally used.

In FIG. 10, excimer lamps 302d-302i can be configured with a substantially same space between each other along housing wall 430. For example, excimer lamps 302d-302i are configured such that one end of excimer lamp 302d substantially faces one end of excimer lamp 302g, one end of excimer lamp 302e substantially faces one end of excimer lamp 302h, and one end of excimer lamp 302f substantially faces one end of excimer lamp 302i. Excimer lamps 302d-302i can be any one of excimer lamps 302 and 302a-302c described above in conjunction with FIGS. 4A, 5A, 6A, and 7A.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. An apparatus for generating excimer radiation, the apparatus comprising:
a housing wall;
an elongated reflector in the shape of a elongated cuboid having a semi-cylindrical cut-out along the major dimension of the elongated reflector;
an elongated electrode disposed parallel to the major dimension of the elongated reflector; and
a tubular body around the elongated electrode, the tubular body including an outer wall and an inner wall, wherein the tubular body has a first end extending out of the housing wall of the apparatus, and a second end extending into an interior region of the apparatus, and wherein at least one inert gas disposed between the outer wall and the inner wall, wherein the elongated reflector and the elongated electrode are configured to excite the inert gas to illuminate an excimer light,
wherein the tubular body includes a partition wall, substantially adjacent to the housing wall, that separates the tubular body into a first area adjacent to the first end extending out of the housing wall from a second area adjacent to the second end extending into the interior region, and wherein the first area is filled with a gas that does not generate excimer light;
wherein the elongated electrode is surrounded by the tubular body such that the elongated electrode and the elongated reflector are in separate compartments,
wherein the semi-cylindrical cut-out surrounds a portion of the outer wall of the tubular body, and
wherein the elongated reflector is configured to reflect the excimer light.

2. The apparatus of claim 1 wherein the elongated reflector is electrically coupled with the housing wall.

3. The apparatus of claim 1 wherein a pressure is provided within a space between the electrode and the tubular body, such that the electrode and the housing wall are substantially free from exciting gas within the space.

4. The apparatus of claim 1 wherein the partition wall contacts the inner wall and the outer wall of the tubular body.

5. The apparatus of claim 1 wherein the tubular body includes a dielectric material region having an edge adjacent to the housing wall.

6. An apparatus for excimer curing dielectric material, the apparatus comprising:
a chamber defining a substrate processing region;
a substrate support configured within and at a bottom region of the chamber; and
at least one excimer lamp separated from the substrate support and configured to generate and transmit radiation to a substrate positioned over the substrate support, each of the at least one excimer lamp comprising:
an elongated electrode;
a tubular body around the elongated electrode, the tubular body including an outer wall and an inner wall, wherein the tubular body has a first end extending out of the housing wall of the apparatus, and a second end extending into an interior region of the apparatus, and wherein at least one inert gas disposed between the outer wall and the inner wall; and
an elongated reflector in the shape of a elongated cuboid having a semi-cylindrical cut-out along the major dimension of the elongated reflector, wherein the elongated reflector is disposed adjacent to the outer wall of the tubular body, wherein the reflector and the electrode are configured to excite the inert gas to illuminate an excimer light for curing the dielectric material,
wherein the tubular body includes a partition wall, substantially adjacent to the housing wall, that separates the tubular body into a first area adjacent to the first end extending out of the housing wall from a second area adjacent to the second end extending into the interior region, and wherein the first area is filled with a gas that does not generate excimer light; and
wherein the semi-cylindrical cut-out surrounds a portion of the outer wall of the tubular body.

7. The apparatus of claim 6 wherein a pressure is provided within a space between the elongated electrode and the tubular body, such that the elongated electrode and the elongated reflector are free from exciting gas within the space.

8. The apparatus of claim 6 wherein the tubular body is around the elongated electrode, such that the elongated electrode is free from being exposed within the chamber.

9. The apparatus of claim 6 wherein the tubular body includes a dielectric material region having an edge adjacent to a chamber wall of the chamber.

10. The apparatus of claim 6 wherein the second end extends through the interior region of the apparatus and out of the housing wall in a different location than the first end.

11. The apparatus of claim 6 wherein the at least one excimer lamp includes a first excimer lamp and a second excimer lamp, the first excimer lamp having a first end extending out of the housing wall at a first location on the apparatus, and a second end extending toward the center of the chamber, and the second excimer lamp having a first end extending out of the housing wall at a second location opposite the first location, and a second end extending toward the center of the chamber.

12. The apparatus of claim 6 wherein the at least one excimer lamp comprises a first excimer lamp and a second excimer lamp, and the first excimer lamp and the second excimer lamp are substantially parallel configured in the interior of the chamber.

13. The apparatus of claim 12 wherein the first excimer lamp and the second excimer lamp are configured near to the center of the chamber.

14. The method of claim 6, wherein the excimer light has a range of bandwidth substantially concentrating at about 152 nm, 172 nm, 193 nm, 222 nm, 248 nm or 303 nm.

* * * * *